(12) United States Patent
Liu

(10) Patent No.: US 9,941,860 B1
(45) Date of Patent: Apr. 10, 2018

(54) FILTER CIRCUIT FOR NOISE CANCELLATION EARPHONES

(71) Applicant: Zoey Liu, Shenzhen (CN)

(72) Inventor: Zoey Liu, Shenzhen (CN)

(73) Assignee: Shenzhen Shengyuan Tech Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/342,133

(22) Filed: Nov. 3, 2016

(30) Foreign Application Priority Data

Oct. 21, 2016 (CN) .......................... 2016 1 0919116

(51) Int. Cl.
*H03H 11/12* (2006.01)
*G10K 11/178* (2006.01)

(52) U.S. Cl.
CPC ..... *H03H 11/1217* (2013.01); *G10K 11/1784* (2013.01); *G10K 2210/1081* (2013.01); *G10K 2210/3026* (2013.01); *G10K 2210/3028* (2013.01)

(58) Field of Classification Search
CPC .............. G10K 11/16; G10K 11/178; G10K 2210/1081; G10K 2210/3056; H04R 19/04; H04R 1/1083; H04R 2460/01; H04R 3/06
USPC .... 381/71.1–71.4, 94.1–94.4, 92, 74, 56–58, 381/104–107
See application file for complete search history.

(56) References Cited

U.S. PATENT DOCUMENTS

| | | | | |
|---|---|---|---|---|
| 3,944,756 A | * | 3/1976 | Lininger | H04R 1/086 381/111 |
| 5,381,473 A | * | 1/1995 | Andrea | H04M 1/05 379/388.03 |
| 5,579,397 A | * | 11/1996 | Ikeda | H03F 3/1855 381/113 |
| 6,421,448 B1 | * | 7/2002 | Arndt | H04R 25/407 381/312 |
| 6,504,937 B1 | * | 1/2003 | Papadopoulos | H03F 3/183 330/10 |
| 6,978,029 B1 | * | 12/2005 | Ikeda | H04R 3/007 381/111 |

\* cited by examiner

*Primary Examiner* — Lun-See Lao

(57) ABSTRACT

The invention is a filter circuit for noise cancelling earphones wherein one end of the filter circuit for noise cancelling earphones is connected to the circuit for noise cancelling microphones. In the circuit starting from one end of the said noise cancelling microphones circuit connected to the resistor R0 set the first current node. The other end of the said noise cancelling microphones circuit is connected to the ground while the other end of the said resistor R0 is connected to the high level. Lead a circuit from the first current node connected to the input end of high pass circuit, the output end of the said high pass circuit is connected to the input end of gain amplifier circuit, the output end of the said gain amplifier circuit is connected to the input end of trap circuit, the output end of the said trap circuit is connected to the input end of gain feedback amplifier circuit through the resistor R7, the output end of the said gain feedback amplifier circuit is connected to the positive electrode of the speaker circuit while the negative electrode is connected to the ground.

5 Claims, 3 Drawing Sheets

FILTER CIRCUIT FOR NOISE CANCELLATION EARPHONES

FIELD OF THE INVENTION

The invention relates to the earphone devices field. Specifically, it is a filter circuit for noise cancellation earphones.

BACKGROUND OF THE INVENTION

In the present time, to eliminate noise initiatively, people invented the technology called 'active noise reduction', wherein the principle is that it is well known all the sounds consist of a certain frequency spectrum. If we can find a sound whose frequency spectrum is totally the same with the noise to be eliminated but just has an opposite phase position (phase difference of 180°), we can totally counteract the noise. The key of the technology is how to find out the sound to counteract the noise. The actual solution is based on the noise source itself, reversing the phase position of the original noise through electronic circuit.

Now more and more earphones apply the active noise reduction technology. The technology is divided into digital noise reduction and analog noise reduction. For the analog noise reduction, how the filter circuit frequency response curve fits the earphone acoustic frequency response curve is the key factor to influence the effect of noise reduction. The noise reduction circuit of the initiative noise reduction earphone applies the above mentioned discrete components or applies the fitted noise reduction chip incorporating with outer circuit to realize the noise reduction. The situation of narrower range of noise reduction bandwidth sometimes exists, wherein the noise reduction bandwidth is about 100 HZ to 500 HZ. Thus it can not achieve a wider frequency band range of noise reduction, so that the effect of noise reduction is not very good and the fitting degree of frequency response curve is not very high.

SUMMARY OF THE INVENTION

The present invention is aimed to provide a filter circuit for noise cancellation earphones to resolve the problems that the prior noise cancellation earphones can not achieve a wider frequency band range of noise reduction, the effect of noise reduction is not very good and the fitting degree of frequency response curve is not very high due to the fact that the noise reduction circuit of the prior noise cancellation earphones applies the above mentioned discrete components or applies the fitted noise reduction chip incorporating with outer circuit to realize the noise reduction which results in a narrower range of noise reduction bandwidth only 100 HZ to 500 HZ.

To overcome the technical issue above, this invention applies the following technical plan: a filter circuit for noise cancellation earphones is connected to the circuit for noise cancellation microphones. In the circuit starting from one end of the said noise cancellation microphones circuit connected to the resistor R0 sets the first current node. The other end of the said noise cancellation microphones circuit is connected to the ground while the other end of the said resistor R0 is connected to the high electrical level. Draw out a circuit from the first current node connecting to the input end of high pass circuit. The output end of the said high pass circuit is connected to the input end of gain amplifier circuit. The output end of the said gain amplifier circuit is connected to the input end of notch filter circuit. The output end of the said notch filter circuit is connected to the input end of gain feedback amplifier circuit through the resistor R7. The output end of the said gain feedback amplifier circuit is connected to the positive electrode of the speaker circuit while the negative electrode is connected to the ground.

Further, wherein the said high pass circuit includes capacitor C1 and resistor R1 and the said capacitor C1 is connected to resistor R1. Between the said capacitor C1 and the input end of positive electrode of first operational amplifier U1 in the gain amplifier circuit sets the second current node. The other end of the said capacitor C1 is connected to the first current node. In the circuit drawn out from the said second current node sets the resistor R1 whose other end is connected to the ground.

Further, wherein the said gain amplifier circuit includes the first operational amplifier U1, resistors R2 and R3. Between the output end of the said first operational amplifier U1 and the resistors R2 sets the third current node. Between the negative electrode input end of the said first operational amplifier U1 and the resistors R2 sets the fourth current node. In the circuit drawn out from the said fourth current node sets the resistor R3 whose other end is connected to the ground. The positive electrode of power of the said first operational amplifier U1 is connected to positive electrical level while whose negative electrode of power is connected to the ground or to the negative electrical level.

Further, wherein the said notch filter circuit includes resistor R4, resistor R5, resistor R6, capacitor C2, capacitor C3 and capacitor C4. Between the resistor R4 and the fourth current node sets the fifth current node. One end of the said capacitor C3 is connected to the fifth current node, the said resistor R4 is tandem connected to resistor R5, and the said capacitor C3 is tandem connected to resistor C4. The other end of the said resistor R5 is connected to the other end of the capacitor C4 with the sixth current node set in the connecting line and the said sixth current node is connected to the resistor R7. Between the said resistor R4 and resistor R5 sets the seventh current node. In the circuit drawn out from the said seventh current node sets the capacitor C2 whose other end is connected to the ground. Between the said capacitor C3 and capacitor C4 sets the eighth current node. In the circuit drawn out from the said eighth current node sets the resistor R6 whose other end is connected to the ground.

Further, wherein the said gain feedback amplifier circuit includes capacitor C5, resistor R8, resistor R9, capacitor C6, capacitor C7, capacitor C8, resistor R10 and the second operational amplifier U2. Between the input end of negative electrode of the said second operational amplifier U2 and the resistor R7 sets the ninth current node. Between the output end of second operational amplifier U2 and the positive electrode of speaker circuit sets the tenth current node. Between the said ninth current node and the said capacitor C7 sets the eleventh current. Between the said tenth current and the said capacitor C8 sets the twelfth current node. Between the said eleventh current node and the twelfth current node set the capacitor C7 and capacitor C8 in tandem. Between the said capacitor C7 and the capacitor C8 sets the thirteenth current node. In the circuit drawn out from the current node sets the resistor R10 whose other end is connected to the ground.

Between the eleventh current node and the resistor R9 sets the fourteenth current node. Between the twelfth current node and the capacitor C6 sets the fifteenth current node. Between the said fourteenth current node and the fifteenth node set the resistor R9 and capacitor C6 in tandem.

Between the said fourteenth current node and resistor R8 sets the sixteenth current node. Between the said fifteenth current node and resistor R8 sets the seventeenth current node. Between the sixteenth current node and the seventeenth current node sets the resistor R8 which is parallelly connected to capacitor C5.

The input end of positive electrode of the said second operational amplifier U2 is connected to the ground, with positive electrode of power connected to positive electrical level while negative electrode of power connected to ground or the negative electrical level.

Advantageous effects: because that one end of the filter circuit for noise cancellation earphones is connected to the circuit for noise cancellation microphones; in the circuit starting from one end of the said noise cancellation microphones circuit connected to the resistor R0 sets the first current node; the other end of the said noise cancellation microphones circuit is connected to the ground while the other end of the said resistor R0 is connected to the high electrical level; from the first current node draw out a circuit connected to the input end of high pass circuit; the output end of the said high pass circuit is connected to the input end of gain amplifier circuit, the output end of the said gain amplifier circuit is connected to the input end of notch filter circuit; the output end of the said notch filter circuit is connected to the input end of gain feedback amplifier circuit through the resistor R7; the output end of the said gain feedback amplifier circuit is connected to the positive electrode of the speaker circuit while the negative electrode is connected to the ground, and by incorporating with the noise reduction chip of earphones, the present invention can achieve a wider noise reduction frequency range to improve the effect of noise reduction and provide good experience for users.

In the figures, 1 refers to noise reduction microphone circuit, 2 refers to the first current node, 3 refers to the second current node, 4 refers to the third current node, 5 refers to the fourth current node, 6 refers to the fifth current node, 7 refers to the sixth current node, 8 refers to the seventh current node, 9 refers to the eighth current node, 10 refers to the ninth current node, 11 refers to the tenth current node, 12 refers to the eleventh current node, 13 refers to the twelfth current node, 14 refers to the thirteenth current node, 15 refers to the fourteenth current node, 16 refers to the fifteenth current node, 17 refers to the sixteenth current node, 18 refers to the seventeenth current node, 19 refers to the speaker circuit, 20 refers to the high pass circuit, 21 refers to the gain amplifier circuit, 22 refers to notch filter circuit, and 23 refers to gain feedback amplifier circuit.

DETAILED DESCRIPTION

For intuitive and complete understanding of the purpose, technical proposal and advantages of the present invention, combined with the accompanying drawings and the embodiment, the further detailed description of the invention is described as following.

Figure 1:
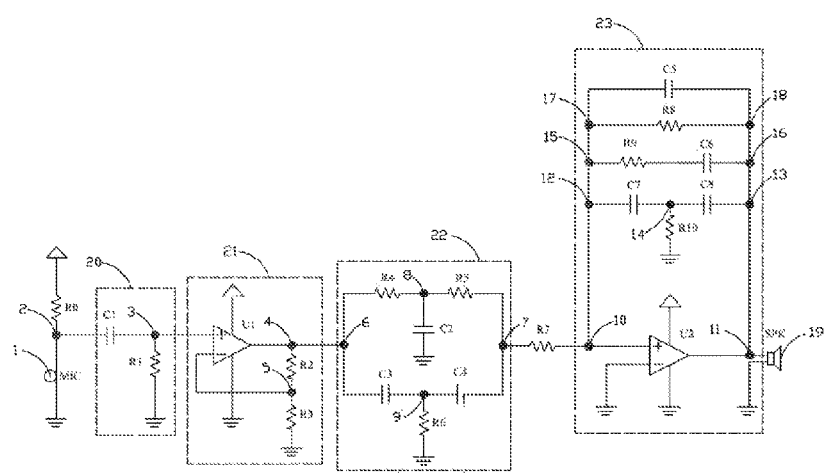
FIG. 1 is the circuit diagram illustrating the filter circuit for noise cancellation earphones.

According to FIG. 1, the circuit diagram illustrating the filter circuit for noise cancellation earphones, wherein one end of the said filter circuit for noise cancellation earphones is connected to the noise cancellation microphones circuit 1. In the circuit starting from one end of the said noise cancellation microphones circuit 1 connected to the resistor R0 sets the first current node 2. The other end of the said noise cancellation microphones circuit 1 is connected to the ground while the other end of the said resistor R0 is connected to the high electrical level. Draw out a circuit from the first current node 2 connected to the input end of high pass circuit 20. The output end of the said high pass circuit 20 is connected to the input end of gain amplifier circuit 21. The output end of the said gain amplifier circuit 21 is connected to the input end of notch filter circuit 22. The output end of the said notch filter circuit 22 is connected to the input end of gain feedback amplifier circuit 23 through the resistor R7. The output end of the said gain feedback amplifier circuit 23 is connected to the positive electrode of the speaker circuit 19 while the negative electrode of 19 is connected to the ground.

The said high pass circuit 20 includes capacitor C1 and resistor R1 and the said capacitor C1 is tandem connected to resistor R1. Between the said capacitor C1 and the input end of positive electrode of first operational amplifier U1 in the gain amplifier circuit 21 sets the second current node 3; the other end of the said capacitor C1 is connected to the first current node 2. In the circuit drawn out from the said second current node 3 sets the resistor R1 whose other end is connected to the ground.

The said gain amplifier circuit 21 includes the first operational amplifier U1, resistors R2 and R3. Between the output end of the said first operational amplifier U1 and the resistors R2 sets the third current node 4. Between the negative electrode input end of the said first operational amplifier U1 and the resistors R2 sets the fourth current node 5. In the circuit drawn out from the said fourth current node 5 sets the resistor R3 whose other end is connected to the ground. The positive electrode of power of the said first operational amplifier U1 is connected to positive electrical level while whose negative electrode of power is connected to the ground or to the negative electrical level.

The said notch filter circuit 22 includes resistor R4, resistor R5, capacitor C2, capacitor C3, resistor R6 and capacitor C4. Between the said resistor R4 and the fourth current node 5 sets the fifth current node 6. One end of the said capacitor C3 is connected to the fifth current node 6. The said resistor R4 is tandem connected to resistor R5 and the said capacitor C3 is tandem connected to resistor C4. The other end of the said resistor R5 is connected to the other end of the capacitor C4 with the sixth current node 7 set in the connecting line and the said sixth current node 7 is connected to the resistor R7. Between the said resistor R4 and resistor R5 sets the seventh current node 8. In the circuit drawn out from the said seventh current node 8 sets the capacitor C2 whose other end is connected to the ground. Between the said capacitor C3 and capacitor C4 sets the eighth current node 9. In the circuit drawn out from the said eighth current node 8 sets the resistor R6 whose other end is connected to the ground.

The said gain feedback amplifier circuit 23 includes capacitor C5, resistor R8, resistor R9, capacitor C6, capacitor C7, capacitor C8, resistor R10 and the second operational amplifier U2. Between the input end of negative electrode of the said second operational amplifier U2 and the resistor R7 sets the ninth current node 10. Between the output end of second operational amplifier U2 and the positive electrode of speaker circuit 19 sets the tenth current node 11. Between the said ninth current node 10 and the said capacitor C7 sets the eleventh current 12. Between the said tenth current and the said capacitor C8 sets the twelfth current node 13. Between the said eleventh current node 12 and the twelfth current node 13 set the capacitor C7 and capacitor C8 in tandem. Between the said capacitor C7 and the capacitor C8 sets the thirteenth current node 14. In the circuit drawn out from the current node sets the resistor R10 whose other end is connected to the ground.

Between the eleventh current node 12 and the resistor R9 sets the fourteenth current node 15. Between the twelfth current node and the capacitor C6 sets the fifteenth current node 16. Between the said fourteenth current node 15 and the fifteenth node 16 set the resistor R9 and capacitor C6 in tandem.

Between the said fourteenth current node 15 and resistor R8 sets the sixteenth current node 17. Between the said fifteenth current node 16 and resistor R8 sets the seventeenth current node 18. Between the sixteenth current node 17 and the seventeenth current node 18 sets the resistor R8 which is parallelly connected to capacitor C5.

The input end of positive electrode of the said second operational amplifier U2 is connected to the ground, with positive electrode of power connected to positive electrical level while negative electrode of power connected to ground or the negative electrical level.

Figure 2:
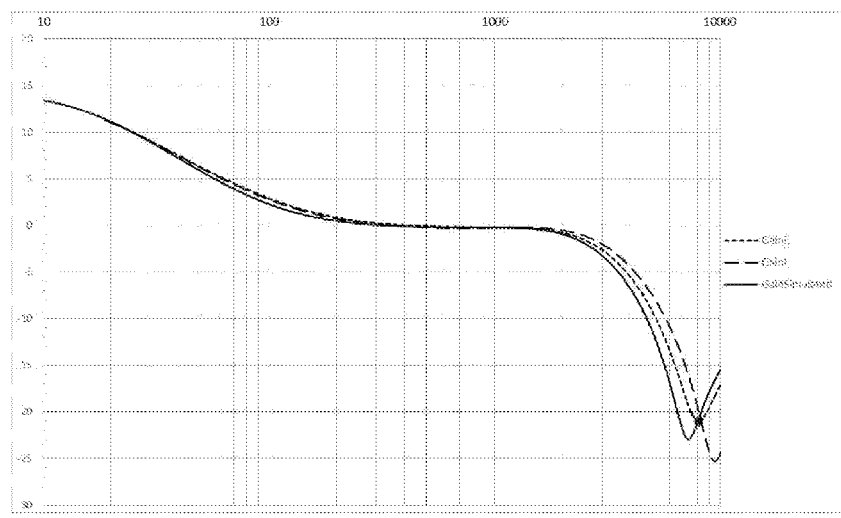
FIG. 2 is the comparison diagram illustrating the fitting situation of the earphone acoustic amplitude-frequency curve and the filter amplitude-frequency curve.

According to FIG. 2, the comparison diagram illustrating the fitting situation of the earphone acoustic amplitude-frequency curve and the actually measured filter amplitude-frequency curve, wherein the horizontal coordinates refer to the frequency with the unit of Hertz; vertical coordinates refer to the gain with unit of decibel. The curve Gain R and the curve Gain L respectively represent the amplitude-frequency curves of right channel and left channel, both of which are dotted lines, wherein the curve Gain R has a higher density while the curve Gain L has a lower density. The curve GainSimulated represents the filter amplitude-frequency curve which is solid line. Thus from the FIG. 2 we can clearly realize that in the range of 100 HZ to 2000 HZ, the fitting situation of the left and right earphone acoustic amplitude-frequency curves and the filter's amplitude-frequency curve is good. Therefore the conclusion is that in the range of 100 HZ to 2000 HZ the effect of noise reduction is remarkable. The invention broadens the frequency range of noise reduction and improves the noise reduction effect of earphones.

Figure 3:
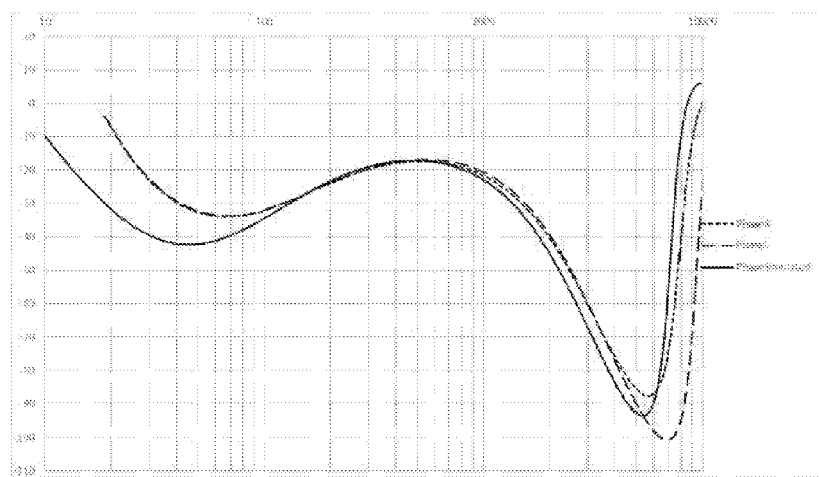
FIG. 3 is the comparison diagram illustrating the fitting situation of the earphone acoustic phase-frequency curve and the filter phase-frequency curve.

According to FIG. 3, the comparison diagram illustrating the fitting situation of the earphone acoustic phase-frequency curve and filter phase-frequency curve, wherein the horizontal coordinates refer to the frequency with the unit of Hertz; vertical coordinates refer to the phase angle with unit of degree. The curve PhaseR and the curve PhaseL respectively represent the phase-frequency curves of right channel and left channel, both of which are dotted lines, wherein the curve PhaseR has a higher density while the curve PhaseL has a lower density. The curve PhaseSimulated represents the filter's phase-frequency curve which is solid line. Thus from the FIG. 3 we can clearly realize that in the range of 100 HZ to 2000 HZ, the fitting situation of the left and right earphone acoustic phase-frequency curves and the filter's phase-frequency curve is good. Therefore the conclusion is that in the range of 100 HZ to 2000 HZ the effect of noise reduction is remarkable. The invention broadens the frequency range of noise reduction and improves the noise reduction effect of earphones.

In the present invention, because that one end of the filter circuit for noise cancellation earphones is connected to the noise cancellation microphones circuit 1; in the circuit starting from one end of the said noise cancellation microphones circuit 1 connected to the resistor R0 sets the first current node 2; the other end of the said noise cancellation microphones circuit 1 is connected to the ground while the other end of the said resistor R0 is connected to the high electrical level; from the first current node 2 draw out a circuit connected to the input end of high pass circuit 20; the output end of the said high pass circuit 20 is connected to the input end of gain amplifier circuit 21; the output end of the said gain amplifier circuit 21 is connected to the input end of notch filter circuit 22; the output end of the said notch filter circuit 22 is connected to the input end of gain feedback amplifier circuit 23 through the resistor R7; the output end of the said gain feedback amplifier circuit 23 is connected to the positive electrode of the speaker circuit 19 while the negative electrode is connected to the ground, and by incorporating with the noise reduction chip of earphones, the present invention can achieve a wider noise reduction frequency range to improve the effect of noise reduction and provide good experience for users.

The above descriptions display the fundamental principles, main features and the advantages of the present invention. It shall be understood by people skilled in the art that the invention is not limited to the above mentioned embodiment. The above mentioned embodiment and specification is just a description of the invention principles. Without beyond the spirit and range of the invention, the present invention will have varies modifications and improvements, all of which will fall into the protection scope of the invention. The protection scope of the invention is dependent on the accompanying claims and its equivalents.

The invention claimed is:

1. The invention is a filter circuit for noise cancelling earphones wherein one end of the filter circuit for noise cancelling earphones is connected to the circuit for noise cancelling microphones; in the circuit starting from one end of the said noise cancelling microphones circuit connected to the resistor R0 set the first current node; the other end of the said noise cancelling microphones circuit is connected to the ground while the other end of the said resistor R0 is connected to the high electrical level; lead a circuit from the first current node connected to the input end of high pass circuit, the output end of the said high pass circuit is connected to the input end of gain amplifier circuit, the output end of the said gain amplifier circuit is connected to the input end of trap circuit, the output end of the said trap circuit is connected to the input end of gain feedback amplifier circuit through the resistor R7, the output end of the said gain feedback amplifier circuit is connected to the positive electrode of the speaker circuit while the negative electrode is connected to the ground.

2. A filter circuit for noise cancelling earphones according to claim 1, wherein the said high pass circuit includes capacitor C1 and resistor R1 and the said capacitor C1 is connected to resistor R1; between the said capacitor C1 and the input end of positive electrode of first operational amplifier U1 in the gain amplifier circuit set the second current node; the other end of the said capacitor C1 is connected to the first current node; in the circuit drawn from the said second current node set the resistor R1 whose other end is connected to the ground.

3. A filter circuit for noise cancelling earphones according to claim 1, wherein the said gain amplifier circuit includes the first operational amplifier U1, resistors R2 and R3; between the output end of the said first operational amplifier U1 and the resistors R2 set the third current node; between the negative electrode input end of the said first operational amplifier U1 and the resistors R2 set the fourth current node; in the circuit drawn from the said fourth current node set the resistor R3 whose other end is connected to the ground; the positive electrode of power of the said first operational amplifier U1 is connected to positive electrical level while whose negative electrode of power is connected to the ground or to the negative electrical level.

4. A filter circuit for noise cancelling earphones according to claim 1, wherein the said trap circuit includes resistor R4, resistor R5, capacitor C3 and capacitor C4; between the resistor R4 and the fourth current node set the fifth current node; one end of the said capacitor C3 is connected to the fifth current node, the said resistor R4 is tandem connected to resistor R5, and the said capacitor C3 is tandem connected to resistor C4; the other end of the said resistor R5 is connected to the other end of the capacitor C4 with the sixth current node set in the connecting line and the said sixth current node is connected to the resistor R7; between the said resistor R4 and resistor R5 set the seventh current node.

5. A filter circuit for noise cancelling earphones according to claim 1, wherein the said gain feedback amplifier circuit includes capacitor C5, resistor R9, capacitor C6, capacitor C7, capacitor C8 and the second operational amplifier U2; between the input end of negative electrode of the said operational amplifier U2 and the resistor R7 set the ninth current node; between the output end of operational amplifier U2 and the positive electrode of speaker circuit set the tenth current node; between the said ninth current node and the said capacitor C7 set the eleventh current; between the said tenth current and the said capacitor C8 set the twelfth current node; between the said eleventh current node and the twelfth current node is tandem connected the capacitor C7 and capacitor C8; between the said capacitor C7 and the capacitor C8 set the thirteenth current node; in the circuit drawn from the current node set the resistor R10 whose other end is connected to the ground; between the eleventh current node and the resistor R9 set the fourteenth current node; between the twelfth current node and the capacitor C6 set the fifteenth current node.

* * * * *